(12) United States Patent
Brodsky et al.

(10) Patent No.: US 7,168,958 B1
(45) Date of Patent: Jan. 30, 2007

(54) WADDED-WIRE LGA CONTACT WITH PARALLEL SOLID CONDUCTOR

(75) Inventors: William Louis Brodsky, Binghampton, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/212,007

(22) Filed: Aug. 25, 2005

(51) Int. Cl.
*H01R 12/00* (2006.01)
(52) U.S. Cl. .................................................. 439/66
(58) Field of Classification Search ............... 439/66, 439/91, 71, 61, 72
See application file for complete search history.

(56) References Cited

U.S. PATENT DOCUMENTS

| | | | | |
|---|---|---|---|---|
| 4,209,481 A | * | 6/1980 | Kashiro et al. .............. 264/437 |
| 4,992,053 A | * | 2/1991 | Lindeman et al. ............. 439/66 |
| 5,701,233 A | * | 12/1997 | Carson et al. ............... 361/735 |
| 6,094,115 A | * | 7/2000 | Nguyen et al. .............. 333/260 |
| 6,471,525 B1 | * | 10/2002 | Fan et al. ...................... 439/70 |
| 7,029,289 B1 | * | 4/2006 | Li ............................... 439/66 |

* cited by examiner

*Primary Examiner*—Phuong Dinh
(74) *Attorney, Agent, or Firm*—Rabin & Berdo, P.C.

(57) ABSTRACT

A connector, for example an LGA connector to be used in coupling a circuit board to a chip or a multi-chip module, includes an insulating carrier with a through-holes corresponding to the connections to be made above and below the carrier, and contacts in the through-holes. The contacts include wadded-wire wads that protrude above and below the carrier to make contact with the chip or circuit board, but each also includes a solid conductive member that extends over a major portion of the length of the through-hole and is in electro-mechanical connection with the wadded-wire wad or wads in the hole at numerous points along the length of the through-hole. The solid conductive member includes barbs or projections that penetrate the wadded wire. The solid conductive members thus provide a low-resistance parallel path and can also hold the wadded-wire wad or wads in place. A method of making and system are also disclosed.

19 Claims, 3 Drawing Sheets

US 7,168,958 B1

WADDED-WIRE LGA CONTACT WITH PARALLEL SOLID CONDUCTOR

BACKGROUND OF THE INVENTION

1. Field of the Invention

The invention relates to wadded-wire contacts, especially such contacts for use in an LGA (Land Grid Array) connector used to couple a circuit board to an electronic chip or multi-chip module.

2. Description of the Related Technology

An LGA connector is used for making contact between a system (circuit) board, having an array of contacts, and a substrate, having a corresponding array of LGA-pad contacts, where each of the LGA contacts is aligned with a respective one of the system board contacts. Various types of connectors are known and used for LGA connectors, including wadded-wire contacts. These wire buttons or wads are placed into through-holes in an insulating carrier (plate or sheet) to form the LGA connector. The wads protrude from each end of the hole in the insulating carrier plate to touch and electrically connect with the contacts above and below the insulating carrier, or with mating electrical circuits.

Recently, in order to increase the number of contacts on the chip or multi-chip module (MCM) with a given contact spacing, the area of the side of the MCM facing the LGA connector insulating carrier has been increased by use of the so-called "shallow grind." The shallow grind removes less material around the edge of the MCM and therefore increases the thickness of the ground edge which is clamped in a C-ring to mount the MCM. The shallow grind is essential if the known and reliable hermetic sealing system, described below, is still to be used.

FIG. 1 shows a shallow-ground edge. (FIG. 1 is not a "prior art" figure because it depicts the invention, but it also depicts an exemplary environment of the invention, including the shallow-ground edge.) FIG. 1 shows an MCM substrate 10 that is held, by clamping its upper and lower ground edges (described below) between a base ring 22 and an upper plate 24 (the clamp is not illustrated in FIG. 1). The uppermost surface 11 of the substrate 10 makes contact with solder balls 31 on the bottom of a chip 30, which forms a thermal interface with the upper plate 24; meanwhile, on the lower surface of the substrate 10 are a plurality of LGA pads (electrical contact areas) 17, which make contact with a system board 50 underneath through an LGA connector 100 and its contacts 120. As is further described below, the LGA connector 100 comprises a sheet or plate of insulating material 110 (a carrier), usually of a plastic material, with individual metallic contacts 120 making electrical contact from one side of the connector 100 to the other side, at points corresponding to the locations of the pads 17. In this way the pads 17 on the bottom of the substrate 10 are electrically coupled to the system board 50.

To the left of the solder balls 31 in FIG. 1 is a decline 12 which leads to a lower, ground surface 13. Directly below the decline 12 in FIG. 1, on the underside of the substrate 10, is an incline 15 which connects the lower surface 16 of the substrate 10 to a ground surface 14. The small height difference between the lower surface 16 and the ground surface 14 is what defines the "shallow grind."

FIG. 1 shows that the lower surface of the base ring 22 overlaps the upper surface of the system board 50, so that the height difference of the surfaces 14 and 16 must approximate the thickness of the inwardly-protruding portion of the base ring 22. In the earlier deep grind version (not shown), the incline 15 was longer and farther from the lateral edge of the substrate 10, making for a greater height difference between the surfaces 14 and 16 so that the connector 100 could be relatively thin, but also making for a smaller area of the lower surface 16 and hence a smaller number of LGA pads 17. The use of the illustrated "shallow" grind, as opposed to the "deep" grind, requires that the thickness of the LGA connector 100 be increased from about 0.8 mm to about 2.5 mm, which of course increases the thickness of the carrier 110 and the length of the contacts 120 that pass through the carrier 110.

Between the lower ground surface 13 and the underside of the upper plate 24 is a C-ring 40, which acts as an hermetic seal. Also shown in FIG. 1 are a cushion 41, which acts to distribute the C-ring compression force, and an alignment pin 43 that passes through the carrier plate 110 of the connector 100 into the base ring 22. These represent the conventional known and reliable hermetic sealing system mentioned above.

Although not shown in detail in FIG. 1, the contacts 120 of the connector 100 include wadded-wire portions. Wadded-wire contacts are intrinsically reliable because of the numerous points at which they touch their intended contact surfaces (thought to number three to seven coupling points for each wad), and also themselves (at various points along the length of the wire), which provides multiple current paths, redundancy, and reliability. Statistically, they outperform other types as to failure rate and signal integrity. However, wadded-wire contacts do not operate as well when they are made long, in part because the axial spring constant drops as the length increases. (This happens by an elementary property of springs; for a spring of constant cross-section, the longer it is the lower the spring constant of the whole spring.) Also, the resistance increases with length, and the resistivity of spring metal is typically significantly higher than the resistance of pure copper.

When wadded-wire contacts need to be long, they are conventionally combined with solid-plunger contacts that take up some of the length so that the wadded-wire wads can stay short. Then, electrical contact is made through the wadded-wire wad or wads and the solid plunger or plungers, which are deployed in series within the through-holes. There are various combinations of usually alternating wads and plungers. An example of this prior-art approach is shown in prior-art FIG. 5, where a solid plunger 270 and a wadded-wire wad 250 are both inserted into a through-hole 212 in a plastic carrier plate 210 of a connector 200. The solid plunger 270 provides length and the wad 250 provides resiliency.

This combined plunger-wad contact has the following drawbacks:

First, there is a decrease in reliability (signal integrity or SI), at least in part because a solid plunger introduces another pair of separable interfaces, causing it to be less reliable, and a change in electrical impedance. When they are arranged in series mechanically and electrically, the reliability of the combination cannot be any higher than that of a single contact. The overall contact failure rate can be approximated as the individual contact failure rate multiplied by the number of interfaces.

Second, the DC resistance increases and causes a voltage drop through the MCM-card assembly. Although the solid plunger 270 has low internal resistance, this resistance is in series with that of the wadded wire and the two resistances are additive.

In addition, the center-to-center spacing may be somewhat higher in the case of plunger-wad combinations like that illustrated in FIG. 5. A wad alone typically has a diameter of 0.020 inches and center spacing of 0.040 inches, while a single-wad, single-plunger combination might have the same diameter but a center spacing of 0.050 inches. The same might be true of a plunger-wad-plunger arrangement or a wad-plunger-wad arrangement.

Thus, there has been a need for a longer contact that retains the advantages of the shorter wadded-wire contact.

SUMMARY OF THE INVENTION

It is, therefore a principal object of this invention to provide an enhanced wadded-wire contact having a greater length but having the characteristics of a shorter wadded-wire contact, and a contact assembly, method, and system incorporating this contact.

It is another object of the invention to provide an enhanced contact assembly that solves the above-mentioned problems, and a contact assembly, method, and system thereof.

These and other objects of the present invention are accomplished by the contact, contact assembly, method, and system disclosed herein.

In order to meet the object set out above, and other objects apparent from the discussion below, an aspect of the invention is a parallel-path solid conductor, with which a wadded wire is in contact at places along the mutual length of the solid conductor and the wadded wire. The solid conductor can take various forms, including a conductive tube in which a wadded wire wad or wads are held, and/or a central spear.

This combination provides very high reliability, due to the numerous current paths through the wadded wire and the solid conductor, and also a very low resistance even when the current passes through a great length of wadded wire. The reason for the low resistance is that the solid conductor has a resistance several orders of magnitude lower than an equivalent length of wadded wire. A one-millimeter length of wadded wire has a resistance around 40 milli-ohms, while the resistance of the solid conductor is approximately 40 micro-ohms. According to computer simulations, the resistance of the combination is about that of a short wadded-wire wad, and the increased resistance of a long wadded-wire wad is avoided.

Preferably, the parallel solid conductor includes some means for retaining the wadded wire in place, and/or for increasing the resistance of some central portion of the wadded wire to axial motion, whereby the spring constant at the protruding wad ends may be increased. For example, the spear may include barbs (projections) that penetrate into the wadded wire bundle and hold it axially. In the tubular embodiment, the interior or the tube may include internally-protruding members or a central cross member.

BRIEF DESCRIPTION OF THE DRAWING FIGURES

DETAILED DESCRIPTION OF THE PREFERRED EMBODIMENTS

As discussed above in the Background section, FIG. 1 shows the invention in an exemplary environment of use as an LGA connector 100. The contact portion 120 of the connector 100 is shown in more detail in FIG. 2, which corresponds to a partial view according to FIG. 1.

Figure 2:
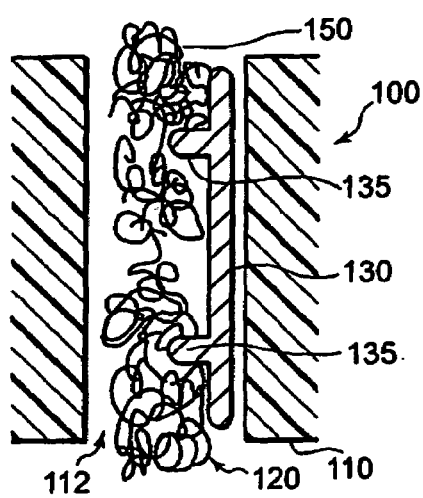
FIG. 2 is a schematic elevational, partially cross-sectional view of the invention.

In FIG. 2, the main body of the connector 100 is a carrier plate or sheet 110 of insulating material, which is shown in a cross section taken perpendicular to the surfaces of the carrier 110 and also parallel to the length of a through-hole 112, which contains the illustrated contact 120. The carrier 110 plate is preferably plastic, for example G10, RYTON, ULTEM, or NORYL. The through-holes might, for example, have a length of about two and one-half millimeters. Preferably, they extend in a direction generally perpendicular to a surface of the insulating carrier. Typically, they might be deployed in a rectangular array pattern, but can be deployed in any arrangement.

The illustrated contact 120, which may be identical to all of the other contacts in the carrier 110, has two main elements: one or more wadded-wire bundles (wads) 150; and a solid conductive member 130 which extends in general along the length of the through-hole 112 and is electrically and mechanically connected to the wadded-wire wad 130 by numerous contact points.

Preferably, the solid conductive member extends over a major portion of the length of the respective through-hole, as is illustrated in FIG. 2. The solid conductive member 130 is preferably longitudinally fixed within the through-hole 112, so that it cannot move longitudinally (parallel to the length of the through-hole 112). Preferably in some cases, it may also be fixed so that it cannot rotate within the through-hole 112. The illustrated member 130 preferably may be in contact with the side of the through-hole 112, held against the hole interior by friction (e.g., press fit), glue, welding, fasteners (including fasteners integral with the member 130, such as the barbs described below), the wadded wire, or any other means (no particular means is illustrated in FIG. 2). Alternatively, the member 130 may also be out of contact with the sides through-hole 112, so that it is located with respect to the through-hole 112 by other contact with the carrier 110, or, by its contact with the wadded wire 150 (which can be fastened to the through-hole 112).

The solid conductive member 130 preferably includes one or more "barbs" (projections, fasteners, or the like, which need not be sharp or pointed) 135 that may penetrate into the mass of wadded wire of the wad 150 for improved mechanical and/or electrical contact between these parts. The barbs 135 may be integral with the body or with body portions of the solid conductive member 130, but may also be separable or permanently attached. If the solid conductive member 130 is formed of sheet metal, the barbs 135 may be formed by bending a tab portion of the solid conductive member 130 over at an angle from the rest of the sheet of metal. The barbs 130 may be pointed, rounded, or of any shape or configuration.

Figure 1:
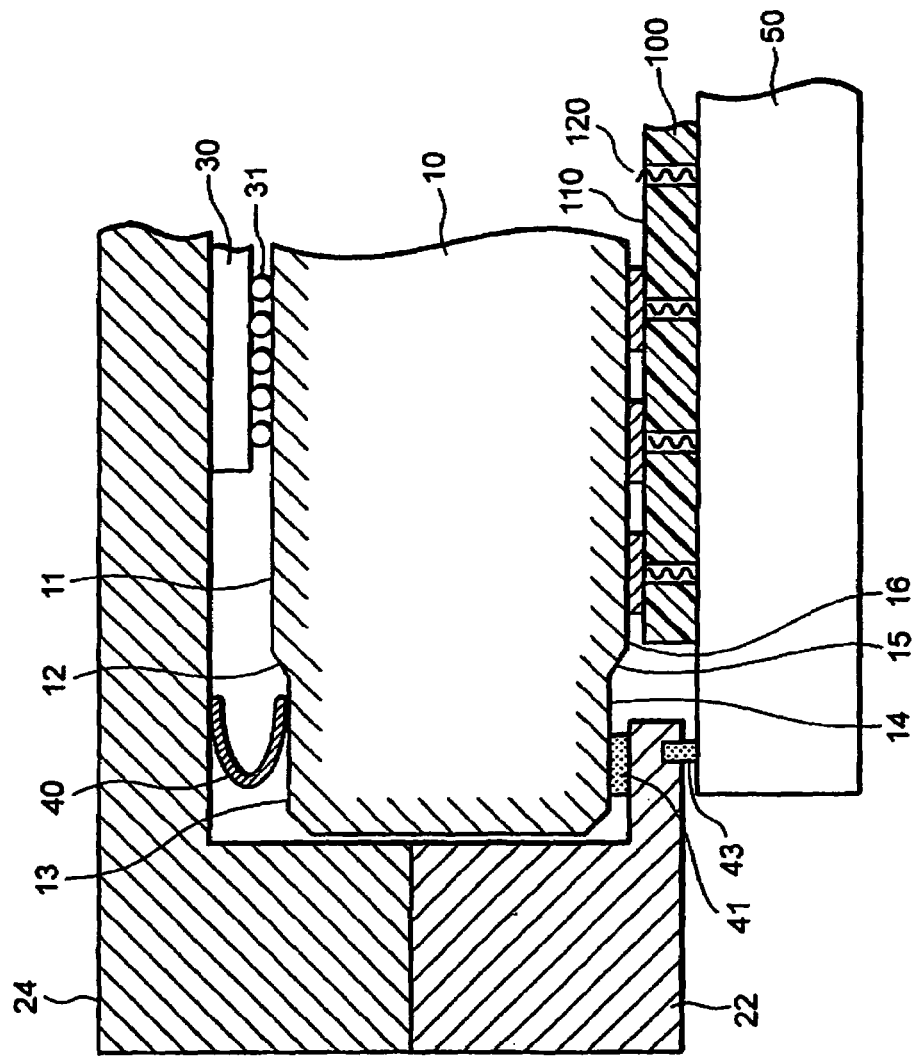
FIG. 1 is an elevational view of the invention in its environment.

Preferably, the wadded-wire wad 150 protrudes from the through-hole above the surface of the insulating carrier 110, on each side, by a distance sufficient to make electrical contact with parts such as the LGA pads 17 of FIG. 1, which typically are larger than the wads they contact. (Depending on the environment of the invention, protruding wads might not be necessary.)

Figure 3:
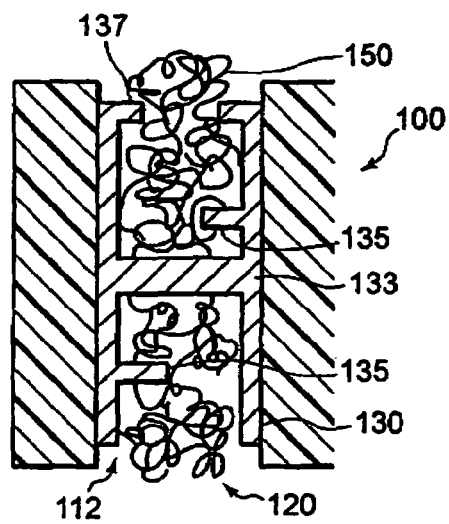
FIG. 3 is an elevational, partially cross-sectional view of the invention according to FIG. 2 in a first variation on the shape of the solid conductor.

FIG. 3 shows the same embodiment as FIG. 2 but the solid conductive member 130 is in contact with the sides of the through-hole 112 and is preferably held there by friction, although adhesive and/or any other locating means can be employed. The solid conductive member 130 of FIG. 3 may be embodied as a hollow cylinder, tube, or sleeve of conductive material, optionally with a compressive resilience feature such as a longitudinal gap or fold. A smooth outer cylindrical surface on a conductive member minimizes coupling and electrical noise, and may be preferable.

The solid conductive member 130 can be fixed into the carrier 110 by being molded in place, in which case the outside of the solid conductive member 130 can be formed to provide a firm mechanical connection between them. The solid conductive member 130 can also be fixed into the carrier 110 by including a flange or other protrusion that rests on at least one of the upper and lower surface of the insulating carrier 110 (not shown).

The barbs 135 may include a central spacer 133 with distinct wads on either side and/or a retention rim 137 that helps to keep the main body of the wadded-wire wad 150 in place, as well as simple barbs 135 protruding from points along the inside of the sleeve.

These simple barbs might be deployed around the inside of the sleeve along a helical path and may also be set to protrude from the inside generally at equal angles around the axis so that the barbs 135 resemble a spiral staircase. For example, there might be four barbs set at 90-degree intervals around the axis of the through-hole 112 and deployed at increasing depths.

Figure 6:
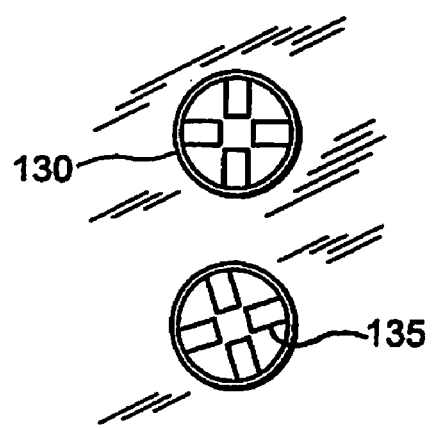
FIG. 6 is a plan view according to FIG. 3.

FIG. 6 illustrates such an arrangement, showing two solid conductive members set into the surface of the insulating carrier 110, each including four barbs 135.

The contact 120 of FIG. 3 can be fabricated with two wads, one above and one below the central spacer 133, where conductive member 130 provides an electrical connection between wadded contacts and an electrical paths for the wads to contacts themselves.

The solid conductive member 130 can be fabricated from flat sheet metal, with the retention rim 137 and barbs 135 formed by stamping, for example, and then the flat piece rolled into a cylindrical shape.

Figure 5:
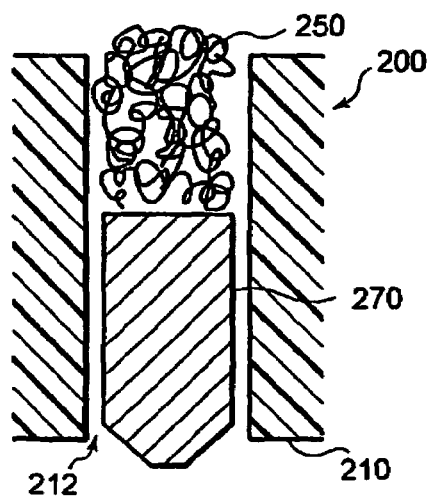
FIG. 5 is an elevational, partially cross-sectional view of the prior art.

The sleeve may have an inside diameter of 0.50 mm (20 mils) and an outside diameter of 0.56 mm (25 mils). The diameter of the through-holes in the invention is preferably 0.56 mm as compared to 0.50 mm in the prior art exemplified by FIG. 5. With the contact center-to-center spacing retained as in the prior art, this greater diameter increases the capacitance between neighboring contacts and is calculated to offset the greater inductance due to the increased length of the contacts.

The length of the solid conductive member 130 is about the same as the thickness of the insulating carrier 110, which will typically be 2.5 mm with shallow grinding. Preferably, it is slightly less than the thickness of the carrier 110 in order to form a stop when the solid conductive member 130 is press-fitted or insert molded, as the plastic material of the insulating sheet 110 expands slightly over the end of the solid conductive member 130.

Figure 4:
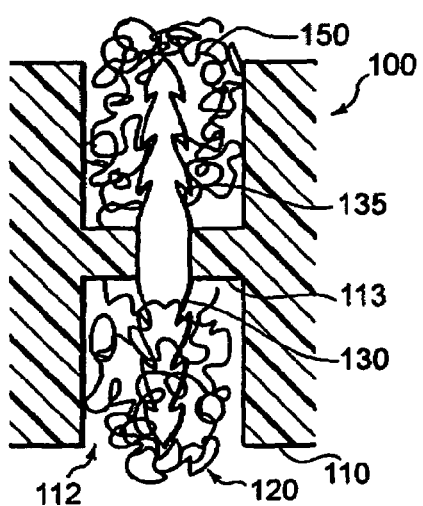
FIG. 4 is an elevational, partially cross-sectional view of the invention according to FIG. 2 in a second variation on the shape of the solid conductor.

FIG. 4 depicts a spear-like solid conductive member 130 that can be fabricated from stamped sheet metal. Unlike the solid conductive member 130 of FIG. 3, it is not rolled into a cylinder. Instead, it is left basically flat and is pressed or molded into a portion 113 of the insulating carrier 110 that protrudes into the through-hole 112. The portion 113 is preferably located in the middle of the through-hole and bridges across; it may even close off the through-hole 112 so that it causes the through-hole to become two blind holes.

The spear-like solid conductive member 130 preferably has multiple barbs 135 to engage the wadded wire 150. These barbs may, as illustrated, include pointed ends and have an inward slant. Other barb shapes, sizes, and arrangements to engage the wadded wire are also within the scope of the invention. Besides the generally flat stamped piece illustrated in FIG. 4, the invention includes such a piece with an axial twist, with sinuous or other types of bends, and other variations.

Figure 7:
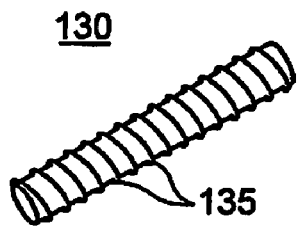
FIG. 7 is a perspective view.

FIG. 7 shows a variation on the contact of FIG. 4. In FIG. 7, the spear-like conductive member 130 has a roll form surface, somewhat like continuously threaded rod on a miniature scale. The thread-like form constitutes a plurality of barbs 135 to engage the wadded wire 150. Like the version shown in FIG. 4, the spear-like conductive member 130 of FIG. 7 may be forced into a central portion 113 like that of FIG. 4, or it may be molded in place. Besides the thread-like barb configuration, other textured-surface configuration can be used in the invention: for example, flanges, points, a roughened surface, hooks, and so on.

As was mentioned above, the combination of the insulating carrier 110 and the solid conductive member 130 can be fabricated, for example, by molding the carrier around the conductive members or by inserting the conductive members 130 into holes pre-formed in the carrier 110. Then the wad or wads of wadded wire 150 can be stitched onto or into the conductive members 130. Other fabrication orders and methods can also be used. In the case of a flat sheet metal part that is then rolled into a cylinder or partial cylinder, the wadded wire can be inserted before rolling so that the barbs 135 penetrate into the wad as the sheet is rolled and it is held securely in the finished contact 120.

The solid conductive member 130 is preferably high-conductivity copper or copper alloy, plated with gold at least on the inside surface. The wadded wire is preferably Mo, BeCu, or other conductive spring material.

In summary, the invention provides a long wadded-wire contact that keeps the advantages of shorter wadded-wire contacts, such as reliability, low electrical resistance, and relatively high spring constant. Because of this (as explained above), it permits an increase in the module LGA contact surface area and the number of contacts without degraded contact performance, and can actually lower contact bulk resistance through member 130. These benefits are provided by the electrical connection between the wadded wire and the solid conductor, and also by their mechanical connection.

We claim:

1. A connector comprising:
   an insulating carrier including a plurality of through-holes each having a length in a direction generally perpendicular to a surface of the insulating carrier; and
   respective contacts in the through-holes;
   each of the contacts further comprising:
   (a) at least one wadded-wire wad protruding from the through-hole above the surface of the insulating carrier on each side thereof;
   (b) a solid conductive member extending over a major portion of the length of the respective wadded-wire wad and being longitudinally fixed in the through-hole, the solid conductive member not protruding from the through-hole above the surface of the insulating carrier on each side thereof; and (c) an electro-mechanical connection between the solid conductive member and the wadded-wire wad, whereby the wadded-wire wad is held in electrical contact with the solid conductive member at numerous points along the length of the wadded-wire wad.

2. The connector of claim 1, wherein the solid conductive member comprises a tube and the tube contains the at least one wadded-wire wad.

3. The connector of claim 2, wherein the tube is without any longitudinal gap.

4. The connector of claim 1, wherein the solid conductive member comprises a spear impaling the at least one wadded-wire wad.

5. The connector of claim 1, wherein the connection between the solid conductive member and the wadded-wire wad comprises a barb of the solid conductive member which penetrates into the wadded-wire wad.

6. The connector of claim 1, wherein the through-hole comprises a bridging portion extending from one side of the through-hole to another side thereof.

7. The connector of claim 6, comprising a first wadded-wire wad above the bridging portion and a second wadded-wire wad below the bridging portion.

8. A system comprising:
a chip or a multi-chip module,
a circuit board,
a connector, and
a clamp,
keeping the chip or a multi-chip module in position on a first surface of the connector and keeping the circuit board in position on a second surface of the connector opposite to the first surface;
the connector further comprising:
an insulating carrier including a plurality of through-holes each having a length in a direction generally perpendicular to a surface of the insulating carrier; and
respective contacts in the through-holes;
each of the contacts further comprising:
(a) at least one wadded-wire wad protruding from the through-hole above the surface of the insulating carrier on each side thereof;
(b) a solid conductive member extending over a major portion of the length of the respective wadded-wire wad and being longitudinally fixed in the through-hole, the solid conductive member not protruding from the through-hole above the surface of the insulating carrier on each side thereof; and
(c) an electromechanical connection between the solid conductive member and the wadded-wire wad, whereby the wadded-wire wad is held in electrical contact with the solid conductive member at numerous points along the length of the wadded-wire wad.

9. The system of claim 8, wherein the solid conductive member comprises a tube and the tube contains the at least one wadded-wire wad.

10. The system of claim 9, wherein the tube is without any longitudinal gap.

11. The system of claim 8, wherein the solid conductive member comprises a spear impaling the at least one wadded-wire wad.

12. The system of claim 8, wherein the connection between the solid conductive member and the wadded-wire wad comprises a barb of the solid conductive member which penetrates into the wadded-wire wad.

13. The system of claim 12, wherein the through-hole comprises a bridging portion.

14. The system of claim 13, comprising a first wadded-wire wad above the bridging portion and a second wadded-wire wad below the bridging portion.

15. A method of making a connector, comprising:
providing an insulating carrier including a plurality of through-holes each having a length in a direction generally perpendicular to a surface of the insulating carrier;
providing respective contacts in the through-holes, wherein each of the contacts further comprises
(a) at least one wadded-wire wad protruding from the through-hole above the surface of the insulating carrier on each side thereof;
(b) a solid conductive member extending over a major portion of the length of the respective wadded-wire wad and being longitudinally fixed in the through-hole, the solid conductive member not protruding from the through-hole above the surface of the insulating carrier on each side thereof; and
(c) an electromechanical connection between the solid conductive member and the wadded-wire wad, whereby the wadded-wire wad is held in electrical contact with the solid conductive member at numerous points along the length of the wadded-wire wad; and
assembling each solid conductive member and each wadded-wire wad into a respective through-hole.

16. The method of claim 15, wherein the step of providing a solid conductive member includes forming barbs from a sheet of metal and then rolling the sheet into a cylindrical shape, and the step of assembling includes inserting the cylindrical shape into the through-hole.

17. The method of claim 16, including wherein the step of rolling the sheet includes rolling the sheet around the wadded-wire wad.

18. The method of claim 15, wherein the step of providing a solid conductive member includes providing a spear-like member including barbs, and the step of assembling includes stitching the wadded-wire wad onto the speak-like member.

19. The method of claim 15, wherein the step of providing a solid conductive member includes providing a spear-like member cut from a length of barbed wire.

* * * * *